UTILITY PRINTED CIRCUIT BOARD

Filed March 18, 1960

INVENTOR.
WILLIAM R. CASTRO

BY John B. Sowell

ATTORNEY 3,217,208
Patented Nov. 9, 1965

1

3,217,208
UTILITY PRINTED CIRCUIT BOARD

William R. Castro, Bryn Mawr, Pa., assignor to Burroughs Corporation, Detroit, Mich., a corporation of Michigan Filed Mar. 18, 1960, Ser. No. 15,948
3 Claims. (Cl. 317—101)

This invention relates to printed circuit boards and more particularly to an improved utility printed circuit board adapted to connect components in a desired circuit configuration.

Printed circuit boards may be considered to be those devices which have conductive prefabricated circuit connections arranged on the surface of a non-conductive member or board. The desired circuit is usually applied to a board according to a predetermined circuit arrangement by several known methods.

Some prior art printed circuit boards are fabricated from a base panel of electrically non-conductive material having at least one side completely covered with an electrically conductive coating or sheet. In order to obtain a printed circuit it is necessary that the conductive sheet be coated with a resist material and etched, leaving a desired circuit configuration.

Other prior art devices employ a prefabricated pattern of conductive material arranged on both sides of the non-conductive member. This prefabricated circuit arrangement may be altered by making interconnections through the non-conductive member to join portions of the patterns on opposite sides of the member, thus producing a prefabricated circuit.

The design of a printed circuit board is time consuming and is not economically justified for small lot production items. When it is necessary to prepare a new circuit by existing methods the delay and cost caused by the design of a single printed circuit board is most prohibitive. It has been the practice in the prior art to either build a single printed circuit by the method described, or to lay out an extensive arrangement assembled with components and terminal strips mounted on a wooden board in a typical breadboard fashion. If the circuit is constructed in this latter fashion, the finished assembly is unwieldly and bears no resemblance to the finished item. Such a breadboard does not permit placing of components in their environmental influence, even though it may suffice to test the circuit theory. It would be desirable to have a utility printed circuit board which could be assembled easily like a breadboard and would permit mounting of components in their environment so that a circuit embodiment which is fully equivalent to a printed circuit board results.

All of the prior art devices are lacking in certain respects to attain this result for they are based on the principle that a definite printed circuit pattern is necessary as an end result.

It is desirable to provide a utility printed circuit board which achieves all the desirable characteristics of a prefabricated printed circuit pattern without the delay and cost of designing the printed circuit pattern.

It is also desirable to provide a utility printed circuit board that can be more easily assembled than a typical breadboard arrangement and still retain the components in the same circuit and environmetal influence as with a printed circuit board prefabricated by the usual methods.

It is desirable that the finished assembly of the utility printed circuit board can be used as a substitute or in lieu of such a prefabricated printed circuit assembly.

It is therefore a general object of the invention to provide an improved printed circuit board.

2

An important object of the invention is to provide a novel printed circuit board which permits the insertion of electronic circuit components and their interconnections without further fabrication of a printed circuit.

A further object of the invention is to provide a utility printed circuit board which may be dip soldered after the components are mounted.

A still further object is to provide a prototype printed circuit board having plug-in connector tabs affixed thereto.

A more specific object is to provide a utility printed circuit board having individual aperture insert positions to provide ease in mounting and demounting the components of the circuits during fabrication or modification of the circuits.

Circuit boards constructed in accordance with the invention for providing a utility printed circuit board may in general comprise a member of non-conductive material for mounting a plurality of components by their associated electrical terminals, a plurality of electrically conductive areas arranged on the surface of said member, each of said conductive areas and said member having apertures extending therethrough for mounting said plurality of electrical components by their associated electrical terminals which extend through said apertures, and electrically conductive terminal tabs arranged along edge portions of said member, each of said tabs and said member having an aperture therethrough for receiving one end of an electrical conductor the other end of which extends through one of said apertures of said areas, whereby said conductive tabs may be electrically coupled to components mounted on said member to form electrical circuits between said terminal tabs.

Other features and objects of the invention will be found throughout the more detailed description of the invention which follows. Those novel features believed descriptive of the nature of the invention are described with particularity in the appended claims. To more clearly portray the invention and its manner of operation the description is supplemented with the accompanying drawings in which:

Figure 1:
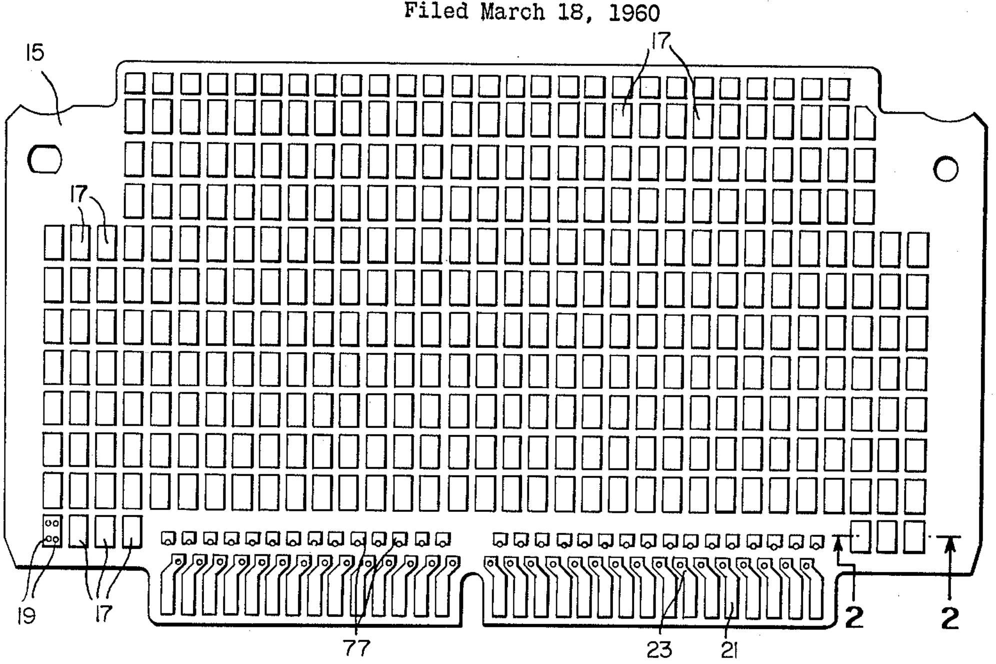
FIG. 1 is a bottom view of a utility printed circuit board in accordance with the invention and showing electrically conductive areas and tabs.
Figure 2:
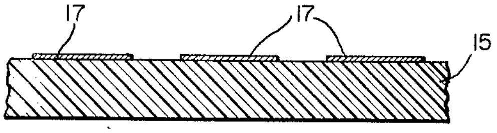
FIG. 2 is a fragmentary sectional view on an enlarged scale taken along line 2—2 of FIG. 1.
Figure 4:
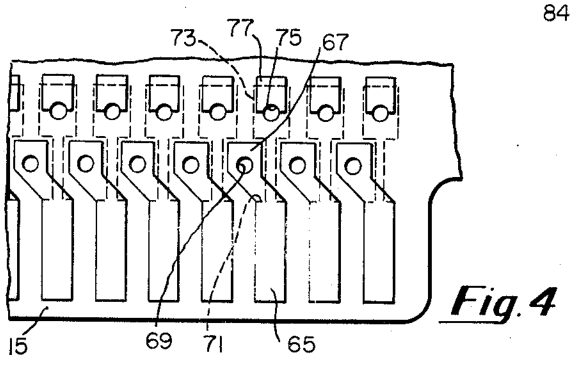
FIG. 4 is a fragmentary top view showing mounted elements comprising components and electrical conductors inserted through apertures in the utility circuit board to provide electrical circuits between conductive tabs.

In general there is provided a two surface utility printed circuit board having conductive areas on the bottom (FIG. 1) and components mounted on the top (FIG. 4). On the bottom side of the utility printed circuit board rectangular conductive areas are provided preferably arranged in a pattern of columns and rows (FIG. 1). A plurality of apertures are provided in these areas so that the conductive leads or terminals of components may be inserted through the board from the top and turned under on the bottom of the board to provide a semi-permanent mounting. Also on the bottom of this board along one edge are provided a series of conductive tabs for connecting the utility printed circuit board into an existing system. A single aperture is provided in each of the tabs into which a conductive lead may be inserted from the top and turned under. The conductive leads from the tabs are carried across the top side of the utility printed circuit board (FIG. 4) and inserted into one of the apertures of the aforementioned areas. The areas serve as terminal connectors and are provided with an aperture for each conductor lead or each component terminals that is inserted to enable modification of the circuit. The bottom side of the utility printed circuit board may be dip soldered after the components are mounted producing a finished product which is fully equivalent to a prefabricated pattern printed circuit board.

Figure 3:
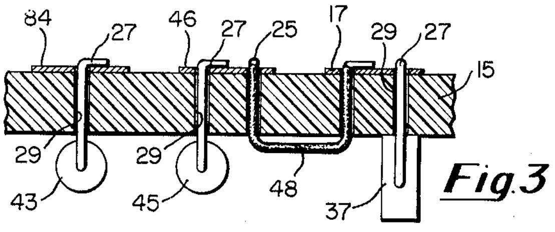
FIG. 3 is a fragmentary sectional view taken through the board and electrical conductive areas showing elements comprising components having electrical terminals extending through apertures and attached to electrically conductive areas, and showing an electrical conductor interconnecting electrically conductive areas.

Referring now to FIG. 1, the utility circuit board comprises an elongated member 15 of electrical non-conductive material, preferably a phenolic or epoxy resin dielectric, which may be of the same size and shape as printed circuit boards using a prefabricated pattern. Areas generally indicated by the numeral 17 are of conductive metallic construction such as copper or silver and spaced apart in rows and columns on the member 15 to allow for electrical isolation. These areas 17 may be applied to both sides of the member 15 and may be provided with prefabricated apertures 19 cut through the conductive areas as guide marks for ease in drilling. In the illustrated preferred embodiment the conductive areas 17 are applied to the bottom side only of the member 15 and are provided with prefabricated apertures 19 shown only on one of the areas in FIG. 1, by way of example, which extend completely through the member 15 and the conductive areas 17. Along the edge of the member 15 are electrically conductive tabs generally indicated by the numeral 21 arranged in a lateral row on the same side of the member 15 as the conductive areas 17. Extending to the rear and connecting the electrical tabs 21 are elongated pads 23. In a preferred embodiment the wearing surface of the tabs 21 are plated with a hard surface electrically conductive material such as conductive brass. The elongated pads 23 are each provided with an aperture extending through the member 15 to allow the insertion of an electrical conductor therethrough. In FIG. 3 the electrical conductor 25 and electrical components terminals 27 mounted adjacent the top surface are passed through the apertures 29 and bent over to provide semi-permanent mounting before the entire bottom of the sheet is dip soldered.

Ordinarily the conductive tabs 21 (FIG. 1) are applied to the same surface of member 15 as the conductive areas 17 to facilitate dip soldering. In a preferred embodiment the tabs are applied to both surfaces of member 15 and the tabs which appear on the bottom of member 15 with areas 17 are covered with a resist material to prevent solder deposits on their surfaces. The tabs on the top side of the member 15 are provided with means for electrically attaching the conductors to the conductive tabs which are not electrically attached by dip soldering as explained hereinafter.

Figure 5:
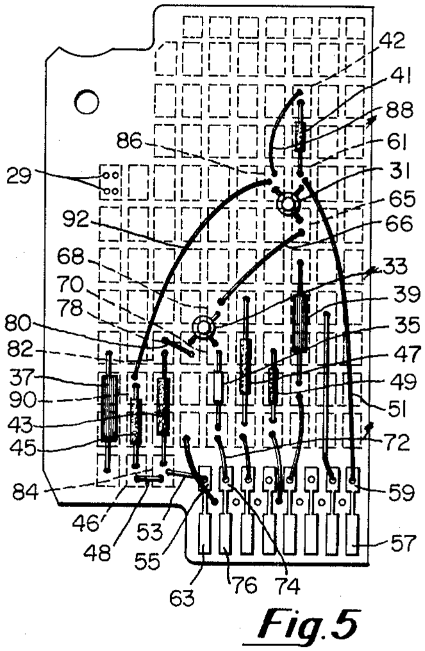
FIG. 5 is an enlarged top view of a portion of the utility printed circuit board showing additional conductive tabs on the top of the circuit board.

As seen in FIG. 5, components 31 and 33 are transistors; component 35 is a diode; components 37 and 39 are capacitors; components 41, 43, 45, 47 and 49 are resistors. Components are preferably mounted resting on the nonconductive top surface of member 15. Electrical conductors like items 51 and 53 are insulated except for their ends which are inserted through the apertures of member 15 and turned under against the conductive areas 17 or pads like item 55 to be joined. Thus it is seen that conductive areas 17 and pads 55 serve as terminal connectors in the utility printed circuit board.

Still with reference to FIG. 5 it is seen by way of example, of how the utility board is used, that an electrical input may be applied to tab 57 where it passes to the elongated pad 59, which is attached to the electrical conductor 51. The circuit continues via conductor 51 to area 61 where the component terminals of resistor 41 and transistor 31, are connected. The circuit continues from area 61 along two parallel paths. The second parallel path being via resistor 41 to area 42 and the first path being via transistor 31 to area 65. The first electrical path from area 65 continues along conductive lead 66 to area 68 and transistor 33. At area 68 the electrical path proceeds in two directions. The first path returns through transistor 33 to area 70 and through diode 35 and conductive lead 72 to pad 74 and tab 76; the first path also returns from area 68 through transistor 33 to conductive area 78 and via conductive lead 80 to area 82; through resistor 43 to conductive area 84 and via lead 53 to elongated pad 55 and conductive tab 63. The second parallel path of the circuit may be traced from area 61 through resistor 41 to area 42 and to area 86 via conductive lead 88 and to conductive area 90 via conductive lead 92 and from area 90 through resistor 45 to area 46 which is connected to area 84 by lead 48. As explained hereinbefore area 84 returns via lead 53 and pad 55 to tab 63. This circuit is illustrative of the mounting of elements and the invention is not limited to any operable circuit. The areas 17 may be of different size and so arranged that components may be automatically mounted by commercially available machines. When it is desirable to automatically insert components into the utility printed circuit board, or even to speed up the operation of inserting components on the board, apertures may be punched or drilled through the board 15 in conductive areas 17 at any stage prior to use. As seen in FIG. 4, tab 65 is on the bottom surface of member 15 and includes an elongated pad 67 with an aperture 69 therein. Shown in dotted lines and in register with tab 65 is an identical tab 71 on the top side of member 15 and having an elongated pad 73 with an aperture 75 therein. Adjacent aperture 75 is a small conductive pad 77 on the bottom side of member 15 which enables dip solder joining of conductors with tab 71 even though tab 71 is not on the same side of the member 15 as the areas 17, or pads 67 and 77 which are dipped in solder.

It is apparent that the conductive areas may be applied to either or both sides of the member and the tabs may be applied to either or both sides of the member, or to more than one edge of the board, and the preferred configuration may be altered without departure from the teaching of this invention as set forth in the appended claims.

What I claim is:

1. A utility printed circuit board for mounting a plurality of electrical circuit components thereon comprising, a substantially flat planar dielectric member having bottom and top surfaces, a plurality of discrete electrically conductive substantially identical areas disposed on the bottom of said planar member in rows and columns, at least a portion of an edge of said planar member being provided with a first plurality of electrically conductive tabs extending toward the central portion of the bottom of said planar member, said tabs being disposed in substantially parallel side by side spaced apart relation and forming electrical connectors for detachably mounting said utility board into associated circuitry, a second plurality of electrically conductive tabs disposed along at least a portion of the top of said edge of said planar member, the portions of said first and second plurality of tabs nearest the edge of said member being in registry, and a plurality of equally spaced conductive pads disposed between said first mentioned tabs and said columns of conductive areas and in registry with said second mentioned tabs for connecting each of said second mentioned tabs to a respective one of said pads, said discrete conductive areas, said first and second mentioned tabs, said pads, and the portions of the dielectric member in line therewith having holes therethrough, whereby electrical components and conductors may be secured adjacent the top surface of said board member with the leads of said electrical components and the ends of said conductors being passed through said holes for electrical connection.

2. A utility printed circuit board for mounting a plurality of electrical circuit components thereon in an orderly array comprising, a substantially flat planar dielectric member having bottom and top surfaces, a plurality of electrically conductive areas disposed on the bottom of said planar member in rows and columns, all of said conductive areas being substantially identical with each other and including a plurality of apertures, at least a portion of an edge of said planar member being provided with a first plurality of electrically conductive tabs extending toward the central portion of the bottom of said planar member, said tabs being disposed in substantially parallel side by side spaced apart relation and each having a first portion constituting an electrical connector for connecting said utility board into associated circuitry and a second jogged portion with an aperture therethrough, a second plurality of electrically conductive tabs disposed along the top of said edge of said planar member and in registry with said first portions of said first mentioned tabs, and a plurality of equally spaced conductive pads having apertures therein cooperating with said second mentioned tabs, said conductive pads being disposed adjacent said first mentioned tabs and in registry with said second mentioned tabs for connecting each of said second mentioned tabs to a respective one of said equally spaced conductive pads by means of conductors inserted through the apertures therein, whereby electrical circuit components mounted in said apertures in said conductive areas and coupled to said tabs by electrical conductors may be connected in electrical circuitry by dip soldering said utility printed circuit board.

3. A utility printed circuit board for mounting a plurality of electrical circuit components thereon in an orderly array comprising, a substantially flat planar dielectric member having bottom and top surfaces, a plurality of isolated electrically conductive substantially identical areas disposed on the bottom of said planar member in equally spaced rows and columns, a portion of an edge of said planar member being provided with a first plurality of electrically conductive tabs, each tab having a portion of its length offset and extending toward the central portion of said planar member, a plurality of electrically conductive pads disposed between said first plurality of tabs and said columns of conductive areas, a second plurality of tabs disposed on the top surface and along said edge of said member, the extremity of each of said second plurality of tabs overlying one of said conductive pads, said first and second plurality of tabs being disposed in substantially parallel side by side spaced apart relation and forming electrical connectors for detachably mounting said utility board into associated circuitry, said discrete conductive areas, said first and said second plurality of tabs, said pads, and the portions of the dielectric member in line therewith having holes therethrough, whereby electrical components and conductors may be secured adjacent the top surface of said dielectric member with the leads of said electrical components and the ends of said conductors being passed through said holes for dip solder connection to said areas, pads, and tabs on the bottom surface of said member.

References Cited by the Examiner

UNITED STATES PATENTS

| | | | |
|---|---|---|---|
| 2,883,447 | 4/59 | Dahl | 317—101 |
| 2,898,518 | 8/59 | Lynn | 317—101 |
| 2,916,805 | 12/59 | Plesser | 317—101 X |
| 2,951,185 | 8/60 | Buck | 317—101 |
| 2,985,709 | 5/61 | Mammola | 317—101 |

JOHN F. BURNS, *Primary Examiner.*

SAMUEL BERNSTEIN, *Examiner.*